United States Patent
You et al.

(10) Patent No.: US 9,159,870 B2
(45) Date of Patent: Oct. 13, 2015

(54) METHOD OF FABRICATING GALLIUM NITRIDE BASED SEMICONDUCTOR DEVICE

(71) Applicant: SEOUL OPTO DEVICE CO., LTD., Ansan-si (KR)

(72) Inventors: Jong Kyun You, Ansan-si (KR); Chang Yeon Kim, Ansan-si (KR); Da Hye Kim, Ansan-si (KR); Tae Hyuk Im, Ansan-si (KR); Tae Gyun Kim, Ansan-si (KR); Young Wug Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 20 days.

(21) Appl. No.: 14/024,179

(22) Filed: Sep. 11, 2013

(65) Prior Publication Data

US 2014/0073120 A1 Mar. 13, 2014

(30) Foreign Application Priority Data

Sep. 13, 2012 (KR) ........................ 10-2012-0101388

(51) Int. Cl.
| H01L 21/30 | (2006.01) |
| H01L 21/46 | (2006.01) |
| H01L 33/00 | (2010.01) |
| H01L 29/20 | (2006.01) |
| H01L 29/66 | (2006.01) |

(52) U.S. Cl.
CPC ........ *H01L 33/0075* (2013.01); *H01L 33/0079* (2013.01); *H01L 29/2003* (2013.01); *H01L 29/66462* (2013.01)

(58) Field of Classification Search
None
See application file for complete search history.

(56) References Cited

U.S. PATENT DOCUMENTS

| 7,713,878 B2 * | 5/2010 | Nakahata ...................... 438/689 |
| 2009/0290610 A1 * | 11/2009 | Eichler et al. ............... 372/44.01 |
| 2011/0198626 A1 * | 8/2011 | Edmond ......................... 257/88 |
| 2012/0070605 A1 * | 3/2012 | Sasaki et al. ................... 428/58 |

FOREIGN PATENT DOCUMENTS

| JP | 2007-221051 | 8/2007 |
| JP | 2010-245338 | 10/2010 |
| JP | 2011-077351 | 4/2011 |
| KR | 10-1161917 | 7/2012 |
| WO | 2008/062783 | 5/2008 |

OTHER PUBLICATIONS

International Search Report Issued on Dec. 20, 2013, in International Patent Application No. PCT/KR2013/008234.

* cited by examiner

*Primary Examiner* — Sonya D McCall Shepard
(74) *Attorney, Agent, or Firm* — H.C. Park & Associates, PLC

(57) ABSTRACT

Exemplary embodiments of the present invention disclose a method of fabricating a gallium nitride (GaN) based semiconductor device. The method includes growing GaN based semiconductor layers on a first surface of a GaN substrate to form a semiconductor stack, and separating at least a first portion of the GaN substrate from the semiconductor stack using a wire cutting technique.

9 Claims, 2 Drawing Sheets

(a)

(b)

(a)

(b)

METHOD OF FABRICATING GALLIUM NITRIDE BASED SEMICONDUCTOR DEVICE

CROSS-REFERENCE TO RELATED APPLICATION

This application claims priority from and the benefit of Korean Patent Application No. 10-2012-0101388, filed on Sep. 13, 2012, which is hereby incorporated by reference for all purposes as if fully set forth herein.

BACKGROUND

1. Field

Exemplary embodiments of the present invention relate to a method of fabricating a gallium nitride (GaN) based semiconductor device, and more particularly, to a method of fabricating a GaN based light emitting diode with a vertical structure using a GaN substrate as a growth substrate.

2. Discussion of the Background

In general, since Group-III element nitrides such as gallium nitride (GaN) and aluminum nitride (AlN) have excellent thermal stability and a direct-transition-type energy band structure, the Group-III element nitrides have recently come into the spotlight as materials to be used for light emitting devices in the visible and ultraviolet light wavelength emission regions. Particularly, blue and green wavelength light emitting devices using indium gallium nitride (InGaN) may be used in various applications, such as large-sized full-color flat panel displays, traffic lights, indoor illumination, high-density light sources, high-resolution output systems, optical communications, and the like.

Since it may be difficult to fabricate a homogeneous substrate on which a Group-III nitride semiconductor layer can be grown, the Group-III nitride semiconductor layer has been grown on a heterogeneous substrate having a similar crystalline structure through a process such as metal organic chemical vapor deposition (MOCVD), molecular beam epitaxy (MBE), or the like. A sapphire substrate having a hexagonal system structure may be used as the heterogeneous substrate. Recently, a technique for fabricating a high-efficiency light emitting diode (LED) with a vertical structure has been developed by growing epitaxial layers, such as nitride semiconductor layers on a heterogeneous substrate, such as a sapphire substrate, bonding a support substrate to the epitaxial layers, and then separating the heterogeneous substrate using a laser lift-off technique or the like. Since the heterogeneous substrate such as the sapphire substrate and the epitaxial layers grown thereon may have different physical properties, the growth substrate can be easily separated by using the interface between the heterogeneous substrate and the epitaxial layer. The separated heterogeneous substrate may be reused as a growth substrate or for another purpose through subsequent surface treatment thereof.

However, the epitaxial layer grown on the heterogeneous substrate may have a relatively high dislocation density due to a lattice mismatch and a difference in thermal expansion coefficient between the epitaxial layer and the growth substrate. It has been found that the epitaxial layer grown on the sapphire substrate generally has a dislocation density of $1 \times 10^8/cm^2$. There may be a limitation on improvement of the light emitting efficiency of an LED using an epitaxial layer having such a high dislocation density.

In order to reduce a crystal defect resulting from the growth of the epitaxial layer on the heterogeneous substrate, there has been a recent attempt to use a GaN substrate as a growth substrate. The GaN substrate is a homogeneous substrate with respect to a GaN based semiconductor layer grown thereon, so that the crystal defect may be greatly reduced to enable growth of a high-quality GaN based semiconductor layer.

However, since the GaN substrate is a homogeneous substrate with respect to the GaN based semiconductor layer grown thereon, it may be difficult to separate the growth substrate from an epitaxial layer by using the interface between the substrate and the epitaxial layer. Accordingly, removing the GaN substrate by means of grinding after the growth of the epitaxial layer is completed may be considered. In this case, however, the GaN substrate cannot be reused, which may increase a total production cost.

Alternatively, separating a GaN substrate from an epitaxial layer by applying a laser lift-off technique may be considered. However, since the GaN substrate is a homogeneous substrate with respect to the epitaxial layer grown thereon, the wavelength range of a laser that may be selected for the laser lift-off technique may be considerably narrow. Accordingly, upon irradiation of the selected laser, most of the laser may be lost due to absorption in the GaN substrate while passing through the GaN substrate.

SUMMARY OF THE INVENTION

Exemplary embodiments of the present invention provide a method of fabricating a GaN based semiconductor device that enables a GaN substrate to be easily separated from an epitaxial layer.

Exemplary embodiments of the present invention provide a method of fabricating a GaN based semiconductor device, in which a GaN substrate can be reused as a growth substrate.

Additional features of the invention will be set forth in the description which follows, and in part will be apparent from the description, or may be learned by practice of the invention.

An exemplary embodiment of the present invention discloses a method of fabricating a GaN based semiconductor device that includes growing GaN based semiconductor layers on a first surface of a GaN substrate, wherein the GaN based semiconductor layers comprise a semiconductor stack, and separating at least a first portion of the GaN substrate from the semiconductor stack using a wire cutting technique.

An exemplary embodiment of the present invention also discloses a method of fabricating a GaN based semiconductor device, the method including growing GaN based semiconductor layers on a first surface of a GaN substrate, wherein the GaN based semiconductor layers comprise a semiconductor stack, forming a sacrificial layer between the GaN based semiconductor layers and the GaN substrate, separating at least a first portion of the GaN substrate from the semiconductor stack using a wire cutting technique, and separating a second portion of the GaN substrate from the semiconductor stack using a laser lift-off technique. The sacrificial layer has a bandgap narrower than a bandgap of the GaN substrate, and the sacrificial layer is configured to absorb light emitted by the laser.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
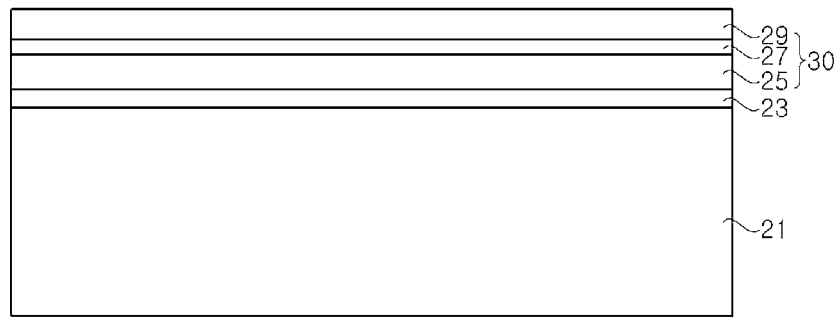
FIGS. 1 to 5 are sectional views illustrating a method of fabricating a gallium nitride (GaN) based semiconductor device according to an exemplary embodiment of the present invention.

The invention is described more fully hereinafter with reference to the accompanying drawings, in which embodiments of the invention are shown. The following embodiment is provided only for illustrative purposes so that those skilled in the art can fully understand the spirit of the present invention. Therefore, the present invention is not limited to the following embodiment but may be implemented in other forms. In the drawings, the widths, lengths, thicknesses and the like of elements are exaggerated for convenience of illustration. Like reference numerals indicate like elements throughout the specification and drawings.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

FIGS. 1 to 5 are sectional views illustrating a method of fabricating a GaN based semiconductor device according to an exemplary embodiment of the present invention. Although a method of fabricating a light emitting diode (LED) with a vertical structure is described in the present exemplary embodiment, the present invention is not necessarily limited to such an LED.

Referring to FIG. 1, a GaN substrate 21 having lower and upper surfaces is first prepared. The GaN substrate 21 may be fabricated from a bulk single crystal that is grown using a hybrid vapor phase epitaxy (HVPE) technique or ammonothermal technique. Particularly, in order to use the GaN substrate 21 as a growth substrate, the upper surface of the GaN substrate 21 is prepared by undergoing surface treatment such as surface polishing.

Then, a semiconductor stack 30 is formed by growing GaN based semiconductor layers on the GaN substrate 21. The semiconductor stack 30 may include, for example, a first conductivity type GaN based semiconductor layer 25, an active layer 27, and a second conductivity type GaN based semiconductor layer 29. The active layer 27 is positioned between the first and second conductive GaN based semiconductor layers 25 and 29. Here, the first and second conductivity types may be n-type and p-type, respectively, but are not necessarily limited thereto, and vice versa.

Each of the first and second conductivity type GaN based semiconductor layers 25 and 29 may be formed as a single- or multi-layered structure. The active layer 27 may be formed as a single or multiple quantum well structure. The semiconductor layers 25, 27 and 29 may be grown on the GaN substrate 21 so as to have a dislocation density of about $5 \times 10^6/cm^2$ or less.

Before the formation of the semiconductor stack 30, a sacrificial layer 23 may be first formed on the GaN substrate 21. The sacrificial layer 23 may comprise a material layer having a bandgap narrower than that of the GaN substrate 21, e.g., a silicon carbide layer, indium nitride layer or indium gallium nitride layer. As shown in this figure, the sacrificial layer 23 may be formed directly on the GaN substrate 21 but is not necessarily limited thereto. For example, before the formation of the sacrificial layer 23, another material layer, e.g., a GaN based layer, may be first formed on the GaN substrate 21.

The semiconductor stack 30 and the sacrificial layer 23 may be grown on the GaN substrate 21 by means of a process such as MOCVD or MBE.

Figure 2:
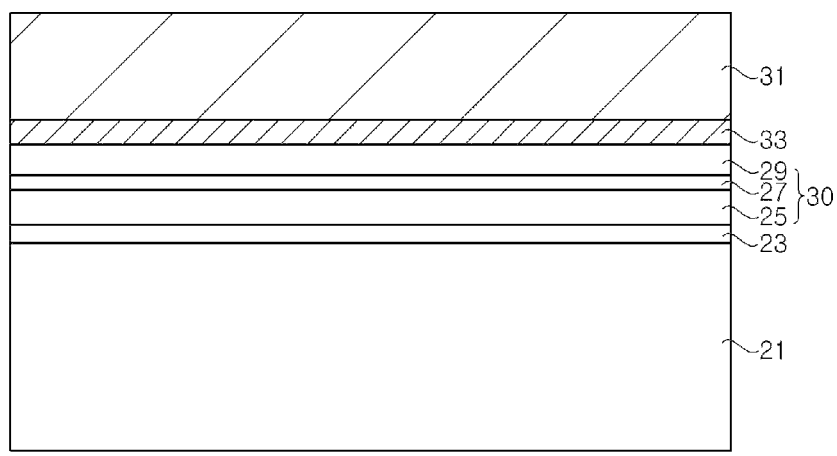

Referring to FIG. 2, a support substrate 31 is formed on the semiconductor stack 30. The support substrate 31 may be a conductive or insulating substrate. The support substrate 31 may be fabricated separately from the semiconductor stack 30 and then attached to the semiconductor stack 30 through a bonding metal 33. Alternatively, the support substrate 31 may be formed on the semiconductor stack 30 by using a plating technique.

Moreover, before the formation of the support substrate 31, a reflective metal layer (not shown) may be formed on the semiconductor stack 30, and an insulating layer and/or a barrier metal layer (not shown) for protecting the reflective metal layer may be formed on the reflective metal layer.

Figure 3:
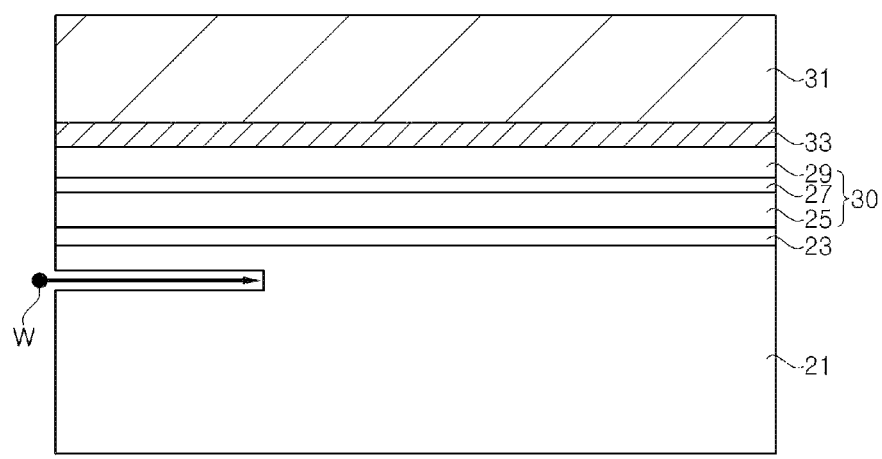

Referring to FIG. 3, the GaN substrate 21 is cut by using a wire cutting technique. A wire W may cut through the interface between the GaN substrate 21 and the semiconductor stack 30 so that the GaN substrate 21 can be separated from the semiconductor stack 30. Alternatively, as shown in this figure, the wire W may cut the GaN substrate 21 from a side surface of the GaN substrate 21.

Figure 4:
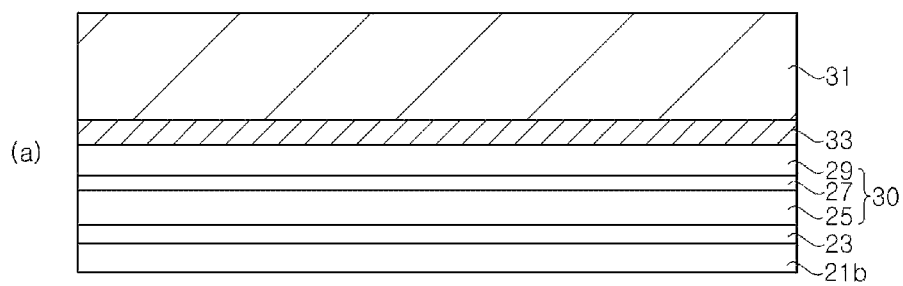

Referring to FIG. 4, in a case where the GaN substrate 21 is cut from the side surface of the GaN substrate 21, a substrate 21a is separated from the semiconductor stack 30, and a portion 21b of the GaN substrate 21 may remain on the side of the semiconductor stack 30. FIG. 4 (a) shows the semiconductor stack 30 on which the portion 21b of the GaN substrate 21 remains, and FIG. 4 (b) shows the substrate 21a separated from the semiconductor stack 30 by using the wire cutting technique.

The portion 21b of the GaN substrate 21, which remains on the side of the semiconductor stack 30, may be removed by means of grinding. Alternatively, the portion 21b of the GaN substrate 21 may be removed from the semiconductor stack 30 by using a dry etching, laser lift-off (LLO), or chemical lift-off (CLO) technique.

For example, since the sacrificial layer 23 has a bandgap narrower than that of the GaN substrate 21, the portion 21b of the GaN substrate 21 may be removed by using a laser with energy which is lower than the bandgap of the GaN substrate 21 but higher than the bandgap of the sacrificial layer 23. The laser emits light that is transmitted through the portion 21b of the GaN substrate 21, which remains on the side of the semiconductor stack 30, and is then absorbed in the sacrificial layer 23. For example, the laser light may have a wavelength in a range of about 370 to 490 nm. Examples of the laser include, but are not particularly limited to, an InGaN laser, a Ti:sapphire laser, an Alexandrite laser, and the like, for example.

In a case where a conventional LLO technique is applied, the laser may irradiate the GaN substrate 21 through the entire thickness thereof that is relatively large, resulting in a large energy loss caused by the GaN substrate 21. Accordingly, it is difficult to separate the GaN substrate 21 by using the LLO technique. However, according to this embodiment, the GaN substrate 21 is cut in advance by using the wire cutting technique, so that the laser can irradiate the portion 21b of the GaN substrate 21 having a relatively small thickness, thereby reducing the energy loss. Thus, according to this embodiment, the remaining portion 21b of the GaN substrate 21 can be easily removed by using the LLO technique.

Figure 5:
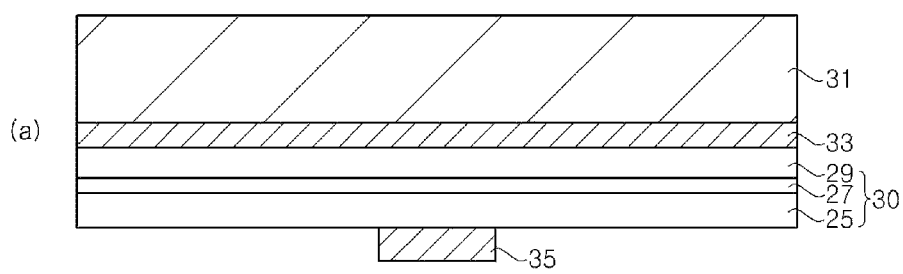
Figure 5:

Referring to FIG. 5, an electrode 35 is formed on the first conductivity type GaN based semiconductor layer 25 exposed due to the removal of the GaN substrate 21. The exposed surface of the first conductivity type GaN based semiconductor layer 25 may be roughened by using a photo electro-chemical etching technique before the formation of the electrode 35. In addition, the exposed surface of the first conductivity type GaN based semiconductor layer 25 may be dry- or wet-etched to remove a remaining impurity or damaged region on the surface.

Then, dividing into individual devices is performed to complete LEDs with a vertical structure.

Meanwhile, the substrate 21a separated from the semiconductor stack 30 may be reused as a growth substrate for growing another GaN based semiconductor layer. For the reuse thereof as the growth substrate, a GaN based layer may be grown on the separated substrate 21a, so that the thickness of the substrate 21a can be recovered to that of the substrate 21.

Although the method of fabricating the LED has been described in this embodiment, the present invention is not limited to the LED, and various GaN based semiconductor devices such as a high electron mobility transistor (HEMT) may be fabricated by using GaN based semiconductor layers grown on a GaN substrate.

According to an exemplary embodiment of the present invention, since at least a portion of the GaN substrate is separated from the semiconductor stack by using the wire cutting technique, the GaN substrate may be easily separated. Moreover, the separated GaN substrate can be reused as a growth substrate. Further, semiconductor layers are grown by using the GaN substrate as a growth substrate, thereby enabling formation of a semiconductor stack with a low dislocation density. Accordingly, it is possible to fabricate a high-efficiency LED with a vertical structure.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a gallium nitride (GaN) based semiconductor device, the method comprising:

growing GaN based semiconductor layers on a first surface of a GaN substrate, wherein the GaN based semiconductor layers comprise a semiconductor stack and have a dislocation density of about $5 \times 10^6/\text{cm}^2$ or less;

separating at least a first portion of the GaN substrate from the semiconductor stack using a wire cutting technique to decrease a thickness of the GaN substrate; and removing a second portion of the GaN substrate remaining on the semiconductor stack using a laser lift-off.

2. The method of claim 1, further comprising:

forming a support substrate on the semiconductor stack before separating the first portion of the GaN substrate.

3. The method of claim 1, further comprising:

forming, before forming the semiconductor stack, a sacrificial layer between the GaN substrate and the semiconductor stack, the sacrificial layer having a bandgap narrower than a bandgap of the GaN substrate.

4. The method of claim 1, further comprising:

growing a GaN based layer on the first portion of the GaN substrate after the first portion is separated from the semiconductor stack.

5. The method of claim 1, wherein the semiconductor stack comprises:

a first conductivity type GaN based semiconductor layer;

a second conductivity type GaN based semiconductor layer; and an active layer disposed between the first and second conductivity type GaN based semiconductor layers, wherein the GaN based semiconductor device comprises a light emitting diode.

6. The method of claim 3, wherein the sacrificial layer comprises indium nitride or indium gallium nitride.

7. A method of fabricating a gallium nitride (GaN) based semiconductor device, the method comprising:

growing GaN based semiconductor layers on a first surface of a GaN substrate, wherein the GaN based semiconductor layers comprise a semiconductor stack and have a dislocation density of about $5 \times 10^6/\text{cm}^2$ or less;

forming a sacrificial layer between the GaN based semiconductor layers and the GaN substrate;

separating at least a first portion of the GaN substrate from the semiconductor stack using a wire cutting technique to decrease a thickness of the GaN substrate; and separating a second portion of the GaN substrate from the semiconductor stack using a laser lift-off technique, wherein the sacrificial layer has a bandgap narrower than a bandgap of the GaN substrate, and the sacrificial layer is configured to absorb light emitted by the laser.

8. A method of fabricating a device, the method comprising:

forming a sacrificial layer on a GaN substrate;

growing at least one GaN based semiconductor layer on the sacrificial layer, wherein the GaN based semiconductor layer has a dislocation density of about $5 \times 10^6/\text{cm}^2$ or less;

separating, using a wire, a first portion of the GaN substrate from a remaining portion of the GaN substrate to decrease a thickness of the GaN substrate;

removing the sacrificial layer and the remaining portion of the GaN substrate by using a laser.

9. The method of claim 8, wherein the sacrificial layer comprises indium nitride or indium gallium nitride.

* * * * *